United States Patent [19]

Oppelt et al.

[11] Patent Number: 4,825,159
[45] Date of Patent: Apr. 25, 1989

[54] METHOD FOR OPERATING A NUCLEAR MAGNETIC RESONANCE TOMOGRAPHY APPARATUS

[75] Inventors: Arnulf Oppelt, Spardorf; Hubertus Fischer; Helmut Barfuss, both of Erlangen, all of Fed. Rep. of Germany

[73] Assignee: Siemens Aktiengesellschaft, Berlin and Munich, Fed. Rep. of Germany

[21] Appl. No.: 183,231

[22] Filed: Apr. 19, 1988

[30] Foreign Application Priority Data

Apr. 30, 1987 [DE] Fed. Rep. of Germany ....... 3714368

[51] Int. Cl.$^4$ ............................................. G01R 33/20
[52] U.S. Cl. ...................................... 324/309; 324/307
[58] Field of Search ............... 324/300, 307, 309, 311, 324/312, 313, 314; 128/653

[56] References Cited

U.S. PATENT DOCUMENTS

| | | | |
|---|---|---|---|
| 4,070,611 | 1/1978 | Ernst | 324/309 |
| 4,563,647 | 1/1986 | Young | 324/309 |
| 4,649,345 | 3/1987 | Yoda et al. | 324/309 |
| 4,649,346 | 3/1987 | Young et al. | 324/309 |
| 4,665,367 | 5/1987 | Kramer et al. | 324/309 |
| 4,694,253 | 9/1987 | Le Roux | 324/309 |
| 4,703,270 | 10/1987 | Hall et al. | 324/309 |
| 4,714,081 | 12/1987 | Dumoulin | 324/309 |
| 4,739,266 | 4/1988 | Kunz | 324/309 |
| 4,774,466 | 9/1988 | Sattin | 324/309 |
| 4,780,674 | 10/1988 | Breton | 324/309 |

Primary Examiner—Michael J. Tokar
Attorney, Agent, or Firm—Hill, Van Santen, Steadman & Simpson

[57] ABSTRACT

An examination subject is irradiated with a sequence of RF pulses. Negative gradient pulses $G_{z3}$ and $G_{y4}$, as well as a phase-coding gradient $G_{x2}$ are generated preceding each RF pulse. Negative gradient pulses $G_{z2}$ and $G_{y1}$, as well as a phase-coding gradient $G_{x1}$, are generated following each RF pulse. The phase-coding gradient $G_{x1}$ is inverted relative to the phase-coding gradient $G_{x2}$. The negative gradient pulse $G_{y1}$ is followed by a positive gradient pulse $G_{y2}$ which serves as a read-out gradient during which a first signal $S_1$ is received. A positive gradient pulse $G_{y3}$ is generated preceding the negative gradient pulse $G_{y4}$, the positive gradient pulse $G_{y3}$ serving as a read-out gradient during which a second signal $S_2$ is received. Two signals having different $T_2$ weighting are thus obtained in each measuring sequence, without extending the measuring time. Two images having different $T_2$ contrast, and thus increased diagnostic value, can thus be produced.

3 Claims, 2 Drawing Sheets

METHOD FOR OPERATING A NUCLEAR MAGNETIC RESONANCE TOMOGRAPHY APPARATUS

BACKGROUND OF THE INVENTION

1. Field of the Invention

The present invention is directed to a method for operating a nuclear magnetic resonance tomography apparatus, and in particular to a method for rapidly generating a magnetic resonance image with improved diagnostic utility.

2. Description of the Prior Art

Magnetic resonance imaging devices are known in the art which have a first set of coils for generating a fundamental or static magnetic field in which an examination subject is disposed, a plurality of further coils for respectively generating gradient magnetic fields in which the examination subject is also disposed, and a coil or antenna for irradiating the examination subject with a sequence of radio-frequency (RF) pulses and for acquiring the resulting nuclear magnetic resonance signals from the examination subject. In such devices, after each RF pulse, a first gradient pulse in a first direction is generated as a de-phasing gradient, and another gradient pulse in at least one second direction is then generated as a first phase-coding gradient. Following the first phase-coding gradient, a first signal, occurring during a second gradient pulse inverted relative to the first gradient pulse, is read-out as a first read-out gradient.

So-called fast imaging sequences have recently been developed for minimizing the time required to obtain the necessary signals to construct a magnetic resonance image. A so-called FLASH sequence is described, for example, in "Rapid Images and NMR-Movies", Haase et al, SMRM, Fourth Annual Meeting, Book of Abstracts (1985), page 980. In this sequence, excitation of nuclear magnetic resonance signals with RF pulses is undertaken with flip angles substantially below 90°, with the fastest possible repetition rate. The image contrast is defined by the longitudinal relaxation time $T_1$.

Another sequence, known as FISP, is described in "FISP-A New MRI Sequence," Oppelt et al, Electromedica 54, Vol. 1, 1986. In contrast to the FLASH sequence, the phase memory of the spin system is exploited in the FISP sequence by refocusing the coding gradient to obtain an image which is determined by the ratio of the longitudinal relaxation time to the transverse relaxation time ($T_1/T_2$).

A FISP sequence of the type utilized in practice is shown in FIG. 2 herein. To obtain nuclear magnetic resonance, the examination subject is exposed to a sequence of RF pulses. A slice selection gradient $G_{z1}$ is generated simultaneously with each RF pulse, so that only the slice of the examination subject defined by its z-coordinate is excited. After such excitation has occurred, a gradient pulse $G_{z2}$, having a negative direction in comparison to the slice gradient $G_{z1}$, is generated. The dephasing of the spin system caused by the slice selection gradient $G_{z1}$ is thus cancelled.

A negative gradient pulse $G_{y1}$ and a phase coding gradient $G_{x1}$ are generated simultaneously with the gradient pulse $G_{z2}$. The spin system is de-phased with the gradient pulse $G_{y1}$, and the FID signal following the RF pulse is thus destroyed. The phase coding gradient $G_{x1}$ is generated after each RF pulse, and impresses phase information on the spin system. The negative gradient pulse $G_{y1}$ is followed by a positive gradient pulse $G_{y2}$, which in turn cancels the de-phasing caused by the gradient pulse $G_{y1}$, and thus generates a spin echo and thus an interpretable signal $S_1$. After the decay of this signal, a second phase coding gradient $G_{x2}$ is generated, which is inverted compared to the first phase coding gradient $G_{x1}$. The de-phasing caused by the first phase coding gradient $G_{x1}$ is thus cancelled.

A modified FISP sequence known as CE FAST (shown in FIG. 3 herein) was presented by Gingel et al the SMRW Conference in 1986 in Montreal, and is described in "The Application Of Steadystate Free Precession (SFP) in 2D-FT MR Imaging," Gingel et al, SMRM, 5th Annual Meeting, Book of Abstracts (1986), page 666. Again, RF pulses are generated in rapid succession simultaneously with a slice selection gradient $G_{z1}$. Each slice selection gradient $G_{z1}$ is preceding by a negative gradient pulse $G_{z3}$, which cancels the de-phasing caused by the slice selection gradient $G_{z1}$. Further, each RF pulse is preceded by a negative gradient pulse $G_{y4}$ and by a phase coding gradient $G_{x1}$. Following each RF pulse, a positive gradient pulse $G_{y3}$, together with a phase-coding gradient $G_{x2}$ which is inverted in comparison to the first phase-coding gradient $G_{x1}$, are generated. A half echo signal, which is shaped to form a full echo signal by the action of the gradient pulses $G_{y4}$ and $G_{y3}$, thus arises, as shown in "Phase and Intensity Anomalies in Fourier Transform NMR," Freeman et al, Journal of Magnetic Resonance, Vol. 4, pages 366–383 (1971).

$T_1/T_2$-weighted images with respectively different information content can be produced with the FISP sequence of FIG. 2, and $T_2$-weighted images having respectively different information content can be produced with the CE FAST sequence of FIG. 3.

SUMMARY OF THE INVENTION

It is an object of the present invention to obtain the information content of both the FISP sequence and the CE FAST sequence without lengthening the measuring time in a nuclear magnetic resonance tomography apparatus.

The above object is achieved in accordance with the principles of the present invention by using the known steps of generating a sequence of RF pulses, generating a first gradient pulse $G_{y1}$ in a first direction, such as the y-direction, as a dephasing gradient and a first gradient pulse $G_{x1}$ in at least one second direction, such as the x-direction, as a first phase-coding gradient, and generating a second gradient pulse $G_{y2}$, inverted relative to the first gradient pulse $G_{y1}$ during which a first signal $S_1$ is read-out. Additionally, in accordance with the principles of the present invention, a third gradient pulse $G_{y3}$ in the first direction, such as the y-direction, is generated preceding each RF pulse during which a second signal $S_2$ is read-out, and a fourth gradient pulse $G_{y4}$, inverted relative to the third gradient pulse $G_{y3}$, is generated in the first direction, such as the y-direction, following the third gradient pulse $G_{y3}$ together with a second gradient pulse $G_{x2}$ in the second direction, for example the x-direction, which is inverted relative to the first phase-coding gradient $G_{x1}$, and which serves as a second phase-coding gradient.

The first signal $S_1$ obtained by this method is $T_1/T_2$-weighted, and the second signal $S_2$ is $T_2$-weighted. Two images having respectively different $T_2$-contrast, and thus improved diagnostic utility, can thus be produced during a substantially non-increased measuring time.

In a further embodiment of the method, resolution in a third dimension or direction is achieved by generating a slice selecting gradient $G_{x1}$ in the third direction, such as the z-direction, simultaneously with each RF pulse, and generating additional gradient pulses $G_{z2}$ and $G_{z3}$, each having an opposite sign relative to the slice selecting gradient $G_{z1}$, respectively preceding and following each slice selecting gradient $G_{z1}$.

In a further embodiment, a three-dimensional data set can be registered by generating respective phase coding gradients $G_{z4}$ and $G_{z5}$ in the third direction, such as the z-direction, respectively preceding and following each RF pulse, the phase-coding gradients $G_{z4}$ and $G_{z5}$ having opposite operational signs.

DESCRIPTION OF THE PREFERRED EMBODIMENTS

Figure 1:
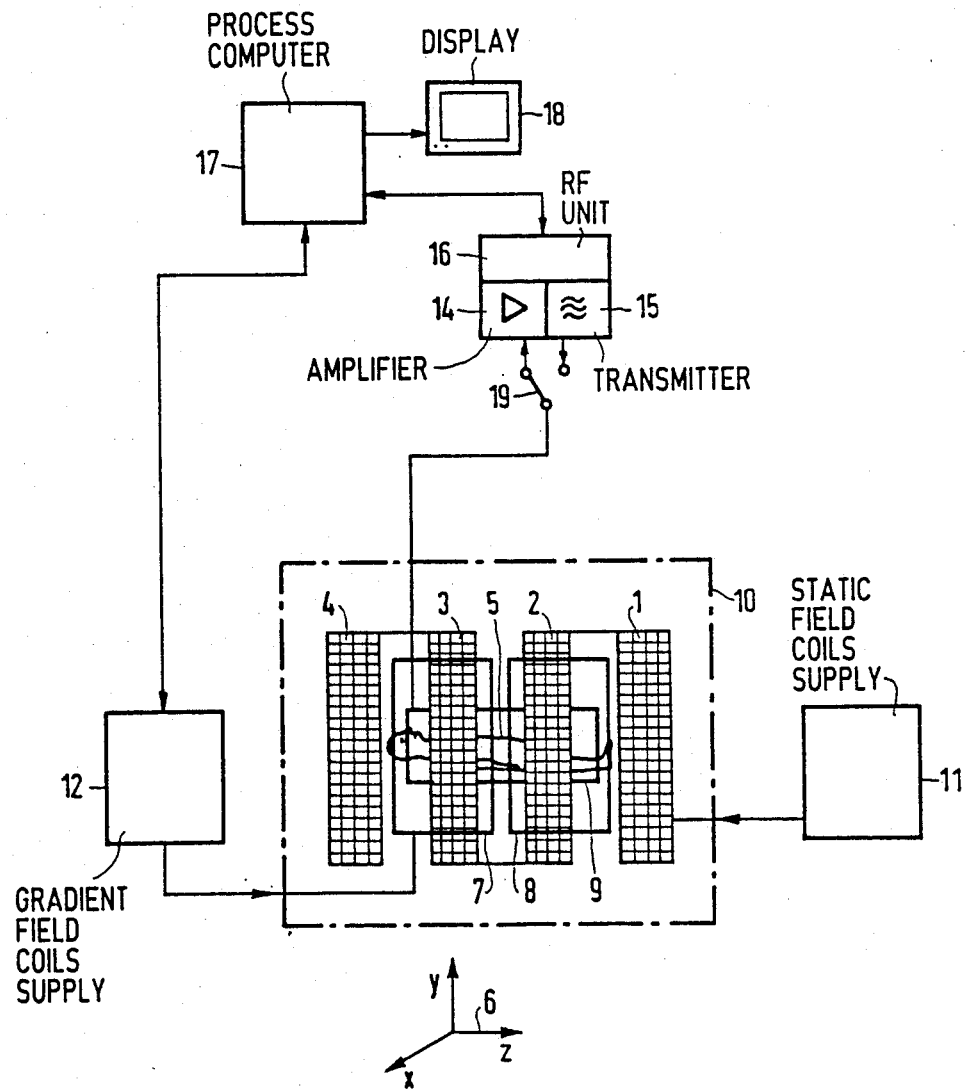
FIG. 1 is schematic block diagram of a nuclear magnetic resonance tomography apparatus of the type for practicing the method disclosed herein.
Figure 2:
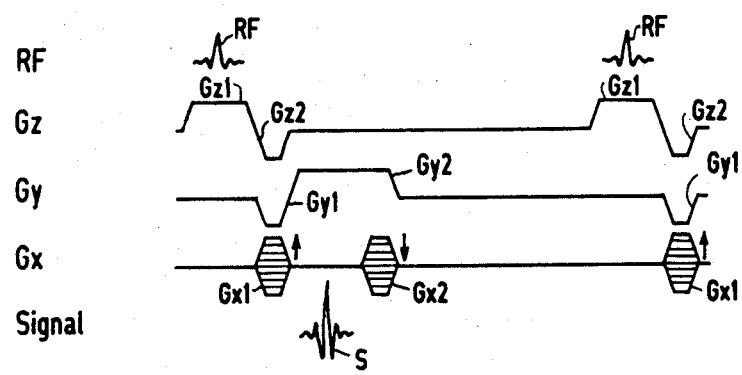
FIG. 2 is an exemplary depiction of a RISP sequence, as described above.
Figure 3:
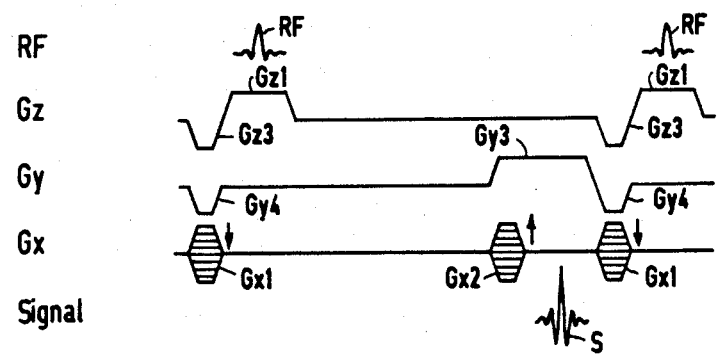
FIG. 3 is an exemplary embodiment of a CE FAST sequence, as described above.

The basic components of a nuclear magnetic resonance tomography apparatus of the type in which the method disclosed herein may be used for producing images of an examination subject are shown in FIG. 1. A static or fundamental magnetic field is generated by coils 1, 2, 3 and 4 in which an examination subject 5 is disposed, such as for examination for medical diagnostic purposes. A plurality of gradient coils, in which the examination subject 5 is also disposed, are provided for generating orthogonal magnetic field gradients in the x-, y- and z-directions, as indicated by the coordinate system 6. For clarity, only gradient coils 7 and 8 are shown in FIG. 1, which generate the x-gradient in combination with a pair of identical gradient coils disposed opposite thereto. Sets of coils (not shown) for generating the y-gradient are disposed parallel to each other above and below the examination subject 5. Sets of coils (not shown) for generating the z-gradient are disposed at the head and feet of the examination subject 5 transversely relative to the longitudinal axis of the subject 5.

The apparatus also includes a RF coil 9 which induces and acquires nuclear magnetic resonance signals in and from the examination subject 5. The coils 1-4 and 7-9, bounded by the dot-dash line 10, represent the actual examination instrument in which the subject 5 is disposed.

The instrument 10 is operated by electrical components including a power supply 11 for the coils 1-4 and a power supply 12 for the gradient coils 7 and 8 and the other gradient coils which are not shown in the drawing. The coil 9 is connected either to a signal amplifier 14, for receiving nuclear magnetic resonance signals from the examination subject 5, or to a RF transmitter 15, for exposing the examination subject 5 to RF pulses, by a switch 19 switchable between a transmission mode and a reception mode. The amplifier 14 and the transmitter 15 are part of an RF unit, which is connected to a process computer 17. The process computer 17 is also connected to the gradient coils power supply 12 and controls the generation of an image from the nuclear magnetic resonance signals. The image constructed from these signals is supplied by the computer 17 to a display 18 for viewing.

Figure 4:
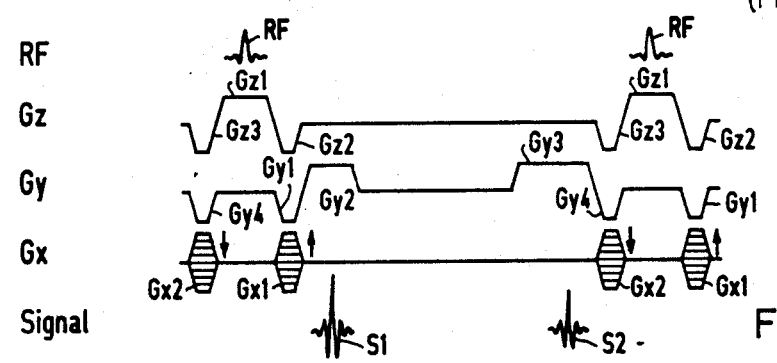
FIG. 4 is an excitation sequence for a method for operating a nuclear magnetic resonance tomography apparatus of the type shown in FIG. 1 according to a first embodiment of the method disclosed herein.

A first exemplary embodiment of a method in accordance with the principles of the present invention for operating the apparatus shown in FIG. 1 to obtain an image of the examination subject 5 is shown in FIG. 4. In this embodiment, the examination subject 5 is exposed to a sequence of radio-frequency pulses RF supplied simultaneously in the presence of a slice selection gradient $G_{z1}$. Each radio-frequency pulse RF is preceded by negative gradient pulses $G_{z3}$ and $G_{y4}$, as well as by a phase-coding gradient $G_{x2}$. The phase-coding gradient $G_{x2}$ is varied in amplitude from radio-frequency pulse to radio-frequency pulse. Each radio-frequency pulse RF is followed by negative gradient pulses $G_{z2}$ and $G_{y1}$, as well as by a phase-coding gradient $G_{x1}$, which is inverted in comparison to the phase-coding gradient $G_{x2}$. The negative gradient pulse $G_{y1}$ is followed by a positive gradient pulse $G_{y2}$, and the negative gradient pulse $G_{y4}$ is preceded by a positive gradient pulse $G_{y3}$.

A state of equilibrium in the transverse magnetization of a lice of the examination subject 5 is produced with the series of selected radio-frequency pulses RF. As explained in the aforementioned article by Freeman ("Phase and Intensity Anomalies in Fourier Transform NMR"), focusing points of the transverse magnetization are formed immediately preceding and following the radio-frequency pulses RF. These focusing points can be imagined in a first approximation as an FID signal $S_+$ and as a half echo signal $S_-$. The FID signal $S_+$ is de-phased by the negative gradient pulse $G_{y1}$, and is again re-phased with the following positive gradient pulse $G_{y2}$, so that an echo signal $S_1$ is obtained from the FID signal $S_+$.

Similarly, the gradient pulse $G_{y3}$ together with the gradient pulse $G_{y4}$ operate to transform the half echo signal $S_-$ into a complete echo signal $S_2$.

Given flip angles grater than 50°, the relationship $$S_2 = S_1 \exp(-2T_1/T_2)$$

is approximately valid for the signal amplitude of $S_2$. This dependence of the signal intensity can be used for calculating the transverse relaxation time $T_2$.

The acquired signals $S_1$ and $S_2$, which are phase-coded in the x-direction by the phase-coding gradients $G_{x1}$ and $G_{x2}$ and are frequency-coded in the y-direction by the gradient pulses $G_{y2}$ and $G_{y3}$ serving as read-out gradients, are used for generation of an image based on the two-dimensional Fourier transform method as described, for example, in U.S. Pat. No. 4,070,611. Given a measuring time which is substantially unaltered in comparison to conventional methods, the method described above produces two images having different $T_2$ contrast by employing the signals $S_1$ and $S_2$. Depending upon the particular application, the information content of one of the images can augment the content of the other image, and thus provide increased diagnostic utility.

Figure 5:
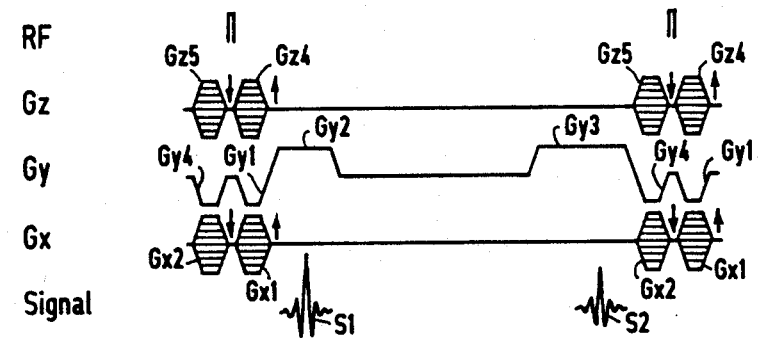
FIG. 5 is an excitation sequence for operating a nuclear magnetic resonance tomography apparatus of the type shown in FIG. 1 according to a further embodiment of the method disclosed herein.

Another embodiment of the inventive method is shown in FIG. 5, wherein a three-dimensional Fourier transform method is used, instead of the above-described two-dimensional Fourier transform method. In this embodiment, the slice selection gradient $G_{z1}$, and the negative auxiliary gradients $G_{z2}$ and $G_{z3}$, are omitted. Instead, phase-coding gradients $G_{z4}$ and $G_{z5}$, which are inverted relative to each other, are generated preceding and following each radio-frequency pulse RF. The sequence remains otherwise unmodified. The three-dimensional Fourier transform method, which is also disclosed in the aforementioned U.S. Pat. No. 4,070,611, provides the advantage of an enhanced signal-to-noise ratio, and the possibility of being subsequently able to reconstruct every desired slice in the measuring volume.

Although modifications and changes may be suggested by those skilled in the art it is the intention of the inventor to embody within the patent warranted hereon all changes and modifications as reasonably and properly come within the scope of their contribution to the art.

We claim as our invention:

1. A method for operating a nuclear magnetic resonance tomography apparatus to obtain an image of an examination subject comprising the steps of:

generating a static magnetic field in which said examination subject is disposed;

exposing said examination subject to a sequence consisting of a plurality of RF pulses;

after each RF pulse, generating a first gradient magnetic field pulse in a first direction as a dephasing gradient and simultaneously generating a first gradient pulse in at least one second direction perpendicular to said first direction as a first phase-coding gradient;

generating a second gradient pulse in said first direction inverted relative to said first gradient pulse in said first direction and simultaneously reading out a first nuclear magnetic resonance signal from said examination subject;

preceding each RF pulse, generating a third gradient pulse in said first direction and simultaneously reading out a second nuclear magnetic resonance signal from said examination subject;

following said third gradient pulse, generating a fourth gradient pulse in said first direction inverted relative to said third gradient pulse and simultaneously generating a second gradient pulse in said second direction as a second phase-coding gradient, said second gradient pulse in said second direction being inverted relative to said first gradient pulse in said first direction; and using said first and second nuclear magnetic resonance signals to generate respectively different images of said examination subject.

2. A method for operating a nuclear magnetic resonance tomography apparatus as claimed in claim 1, comprising the additional steps of:

simultaneously with each RF pulse, generating a slice selecting gradient in a third direction perpendicular to said first and second directions; and generating respective gradient pulses in said third direction preceding and following each slice selecting gradient, said preceding and following pulses having an opposite operational sign with respect to said slice selecting gradient.

3. A method for operating a nuclear magnetic resonance tomography apparatus as claimed in claim 1, comprising the additional step of:

generating respective phase coding gradients in a third direction perpendicular to said first and second directions preceding and following each RF pulse, said phase coding gradients in said third direction having opposite operational signs.

* * * * *